United States Patent [19]

Gegenwarth et al.

[11] Patent Number: 5,384,283
[45] Date of Patent: Jan. 24, 1995

[54] RESIST PROTECTION OF BALL LIMITING METAL DURING ETCH PROCESS

[75] Inventors: Richard E. Gegenwarth; Anthony F. Arnold, both of Poughkeepsie, N.Y.

[73] Assignee: International Business Machines Corporation, Armonk, N.Y.

[21] Appl. No.: 166,183

[22] Filed: Dec. 10, 1993

[51] Int. Cl.⁶ .................. H01L 21/44; H01L 21/48
[52] U.S. Cl. ...................... 437/183; 156/664; 156/666
[58] Field of Search ............... 437/183; 148/105, 106; 156/664, 666

[56] References Cited

U.S. PATENT DOCUMENTS

| | | |
|---|---|---|
| 4,272,561 | 6/1981 | Rothman et al. |
| 4,273,859 | 6/1981 | Mones et al. |
| 4,293,637 | 10/1981 | Hatada et al. |
| 4,427,715 | 1/1984 | Harris ................... 437/183 |
| 4,742,023 | 5/1988 | Hasegawa ............ 437/183 |
| 4,861,425 | 8/1989 | Greer et al. |
| 5,010,389 | 4/1991 | Gansauge et al. |
| 5,027,188 | 6/1991 | Owada et al. |
| 5,171,711 | 12/1992 | Tobimatsu ............ 437/182 |
| 5,268,072 | 12/1993 | Agarwala et al. ...... 156/664 |
| 5,298,459 | 3/1994 | Arikawa et al. ...... 437/183 |

FOREIGN PATENT DOCUMENTS

| | | |
|---|---|---|
| 59-117135A | 7/1984 | Japan. |
| 0305533 | 12/1988 | Japan ................... 437/183 |
| 1194336 | 8/1989 | Japan. |

Primary Examiner—Olik Chaudhuri
Assistant Examiner—C. Everhart
Attorney, Agent, or Firm—Whitham, Curtis, Whitham & McGinn

[57] ABSTRACT

A method of making integrated circuit chip to substrate connections first deposits a blanket layer of CrCu over a completed wafer which has terminal vias etched in the final insulator. Then PbSn solder is electrolytically plated through a photoresist mask. After the plating is done, the resist is removed and the Cu is etched using the solder dot as a mask, and then the solder dots are melted to form spheroid or ball shapes. Next, a positive photoresist is applied in a manner that distributes the photoresist around the base of the solder balls. The solder balls are then used as a self-aligned exposure mask. Since the photoresist under the balls is not exposed, each ball has a concentric layer of resist at the base after exposure and development. This concentric layer of resist protects the Cu/PbSn interface and is used as the mask for etching excess Cr. The resist is then removed.

14 Claims, 1 Drawing Sheet

RESIST PROTECTION OF BALL LIMITING METAL DURING ETCH PROCESS

BACKGROUND OF THE INVENTION

1. Field of the Invention

The present invention generally relates to a method of making integrated circuit (IC) chips to substrates and, more particularly, to a process which provides a protecting resist of a ball limiting metal (BLM) during etch process resulting in the formation of an ideal contact structure.

2. Description of the Prior Art

In recent years, several methods of making integrated circuit chip to substrate connections have been developed. A well-known technique for connecting the chip to a carrier is the Controlled Collapse Chip Connection (C-4) technique developed by the International Business Machines Corp. (IBM) which allows a plurality of input/output (I/O) terminals to be close together. Another well-known technique for packaging chips or carriers is the Tape Automated Bonding (TAB) technique. TAB packaging involves the use of a web of material to carry, electrically conductive leads which provide connections between the chip and the outside world. Another method is to use a molybdenum mask containing holes in the appropriate locations and to evaporate successive layers of chromium (Cr), copper (Cu) and gold (Au) and a lead/tin (PbSn) solder through the mask onto the wafer.

The conventional methods of forming the metal bumps on a semiconductor substrate has the shortcoming that the bonding force of the bumps on the substrate is not sufficient, because the etchant used in the process etches the electrode pads. U.S. Pat. No. 4,293,637 to Hatada et al. discloses an improvement in which strong metal bumps are made, undesirable etching of external lead wires of the semiconductor device is avoided, and metal bumps of substantially uniform height even on different kinds of regions are made.

U.S. Pat. No. 4,273,859 to Mones et al. provides an improved method of forming raised input/output terminals, or I/O bumps, on the top surface of integrated circuits (IC) chips while the IC chips are still integral; i.e., IC elements of a single crystal silicon wafer.

U.S. Pat. No. 5.010,389 to Gansauge et al. relates to the packaging of electronic components on a carrier, preferably on a silicon carrier, and particularly to an IC chip packaging structure which comprises on a substrate different terminals for different packaging or connection techniques.

Japanese Application Nos. 63-18665 and 57-226135 show semiconductor devices in which barrier metals are "stepped" to strengthen contact ball connection.

U.S. Pat. No. 4,861,425 to Greer et al. shows one of the lift-off processes in the art of semiconductor terminal metallurgy, which provides an improved method for the formation and fabrication of terminal metallurgy of integrated circuits. A process is described for selective removal of unwanted metallization from the surface of a semiconductor device.

Another method of forming thin film patterns in the fabrication of integrated circuits utilizing a lift-off mask is shown in U.S. Pat. No. 4,272,561 issued to Rothman et al. This invention relates to a method of depositing thin films, particularly thin films such as metallic films, in the fabrication of integrated circuits.

U.S. Pat. No. 5,027,188 to Owada et al. shows a semiconductor integrated circuit device and, more particularly, a technique which is useful when applied to a semiconductor integrated circuit device of a so-called "flip-chip" system in which a semiconductor chip is mounted to a substrate through solder bumps.

While the art IC chip to carrier connections is well developed, as represented by prior art described above, there remain some problems inherent in this technology. These problems include the etching of one metal in the presence of others, all of which have different electrochemical potentials and anodic reactions, the creation of a stepped structure, and the alignment of the exposure mask.

SUMMARY OF THE INVENTION

It is therefore an object of the present invention to provide a method of making integrated circuit chip to substrate connections which gives control of such factors as stress, adhesion and the like based on an etched outer rim of metal.

It is another object of the invention to provide a chip to carrier mounting technique using a self-aligned resist which is a simple and inexpensive process requiring no mask or alignment.

It is a further object of the invention to provide a chip mounting process that uses a resist solution surface tension to control its distribution around features (i.e., metal balls or spheroids) which form the I/O contacts of the chip.

This invention is a modified form of the C-4 (Controlled Collapse Chip Connection) technology. In this invention, a blanket layer of CrCu is deposited over a completed wafer which has terminal vias etched in the final insulator. Then PbSn solder is electrolytically plated through a photoresist mask. After the plating is done, the resist is removed and the Cu is etched using the solder dot as a mask, and then the solder dots are melted to form spheroid or ball shapes. Next, a positive photoresist is applied in a manner that distributes the photoresist around the base of the solder balls. The solder balls are then used as a self-aligned exposure mask. Since the photoresist under the balls is not exposed, each ball has a concentric layer of resist at the base after exposure and development. This concentric layer of resist protects the Cu/PbSn interface and is used as the mask for etching excess Cr. The resist is then removed.

In some applications, the process can be modified by not melting the solder dots. Even if the solder dots are not melted first to produce the spheroid shape to protect the photoresist from light exposure, some benefit of the process are still realized. This is because the photoresist is thicker at the bases of the solder dots, and the photoresist is less easily exposed in those areas because of the increased thickness.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
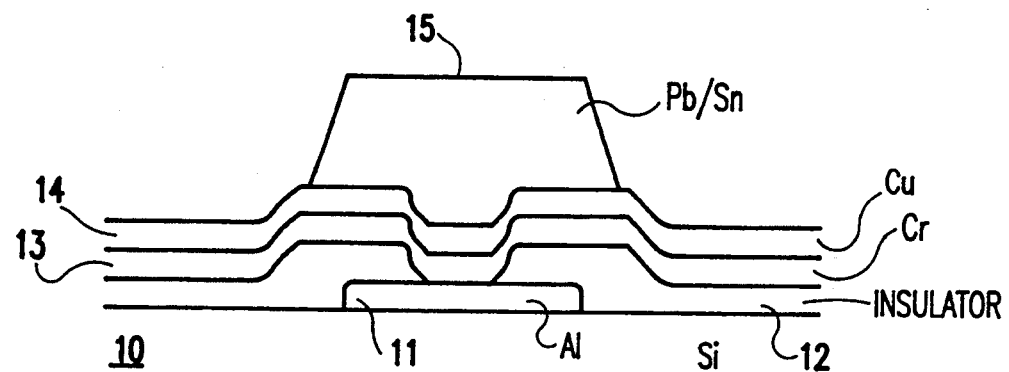
FIG. 1 is a cross-sectional view of the wafer which shows the first step of this invention.

Referring now to the drawings, and more particularly to FIG. 1, there is shown in cross section the silicon (Si) wafer substrate 10 having formed on one surface and aluminum (Al) contact 11. An insulator layer 12 is formed over the substrate 10 and a via is etched in the insulator layer 12 to expose the contact 11. The processes for forming the aluminum contact 11 on the substrate 10 and the insulator layer are conventional, as is the process for etching the via in the insulator layer 12 to expose the contact 11.

In this invention, a blanket of chromium (Cr) 13 is first deposited onto a completed wafer which has terminal vias etched in the final insulator, followed by a blanket of copper (Cu) 14. A photoresist is then applied and patterned. A lead/tin (PbSn) solder 15 is plated through the mask and resist is removed to form the structure shown in FIG. 1.

Figure 2:
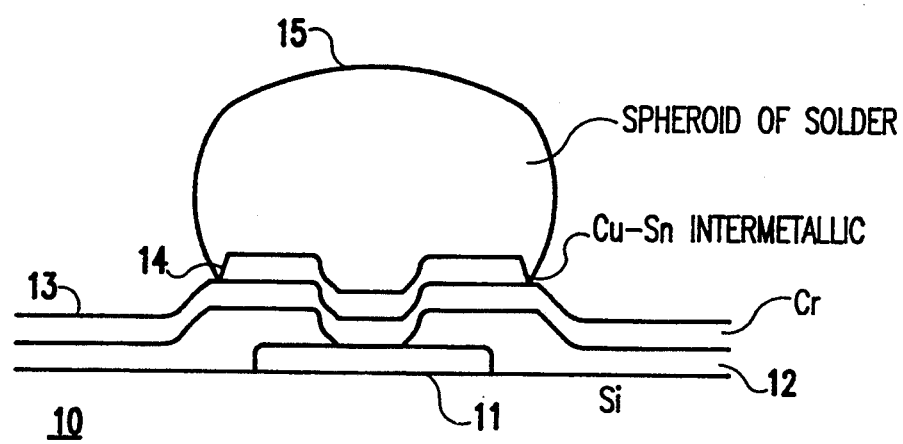
FIG. 2 is a cross-sectional view of the water which shows the next step of the invention in which a spheroid of solder is formed.

Next, as shown in FIG. 2, the Cu layer 14 is etched using the PbSn dot 15 as a mask. For this etching process, suitable etchants such as ammonium persulfate with sulfuric acid can be used. Then the solder is melted in a hydrogen environment to form a ball.

Finally, a positive photoresist is applied by spraying, by spinning or by means of an extrusion tool to provide a thin, uniform coating. The critical feature of this invention is that the resist must be allowed to wet in such a way that the liquid can distribute itself uniformly around the balls based on its surface tension. Control of this process is achieved by setting conditions such that premature evaporation of photoresist solvent does not occur before the liquid distributes itself around each solder ball. Factors that affect this condition are the choice of solvent based on volatility limits, amount of solvent dilution, (if spin coating) spin speed avoiding higher speeds, and slow temperature increase to bake solvent (with the wafer held horizontally) rather than evaporation by air flow. Such conditions are different from typical photoresist application processes.

Figure 3:
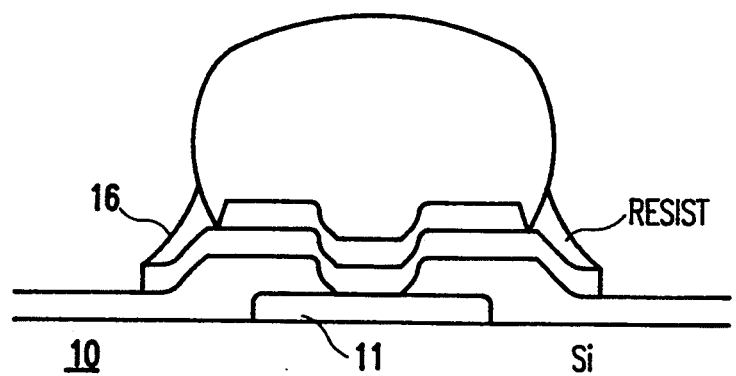
FIG. 3 is a cross-sectional view of the wafer which shows the final stage of the invention in which a self-aligned exposure mask formed at the base of the solder ball is shown.

The solder balls 15 are then used as a self-aligned exposure mask since the resist under the ball will not be exposed. After blanket exposure and development, each ball has a concentric layer of resist 16 at the base as shown in FIG. 3. The Cr layer 13 is then etched from all areas except where covered by the solder ball 15 or the resist 16. Subsequently, the resist is dissolved in a solvent such as acetone, and the waters are ready for testing.

During the process of etching the Cu and Cr metals in the presence of PbSn solder, one must choose etchants that do not attack the solder or which only mildly attack the solder. Of course, different etchants are used to etch each of the individual layers and one must choose them carefully to avoid attack of previously etched layers.

The reliability of C-4 Technology is enhanced by making the diameter of the Cr disc, under the Cu disc, larger. The method according to the invention as disclosed herein assures that the Cr disc will be larger than the Cu disc and simultaneously provides a protective coating to cover the Cu/PbSn interface, the Cu edge and the Cu/Cr interface while etching the Cr layer.

The same process can be used if evaporation of PbSn is performed rather than electroplating of PbSn. A blanket layer of BLM (ball limiting metal) would be deposited. A Riston lift-off mask or a Molybdenum (Mo) lift-off mask would then be used to mask the PbSn. Again, after etching Cu, the solder would be reflowed in hydrogen and the resist applied for protection during Cr etching.

There are other extensions of this process whereby one could sputter deposit Cr in compression and evaporate CrCuAu in tension to reduce the film stress.

Another extension is to sputter Cr to control stress levels and adhesion to certain insulators, such as polyimide, and then evaporate CrCuAu and PbSn through a Molybdenum lift-off mask. Again, the same resist application, etching of the base Cr layer and resist removal sequence used to leave a rim of Cr around each solder ball can be employed.

Still other extensions can be foreseen whereby other metal layers are used, such as Ti/Ni/Cu/Au, Cr/phased CrCu/Cu, or TiW/Cu/Ni, etc., in place of the CrCu described above.

The process can also be modified by not melting the solder dots. Even if the solder dots are not melted first to produce the spheroid shape shown in FIG. 2 thus protecting the photoresist from light exposure, some benefit of the process are still realized. This is because the photoresist is thicker at the bases of the solder dots, and the photoresist is less easily exposed in those areas because of the increased thickness.

Although the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of forming a metallic contact on an integrated circuit comprising the steps of:
    a) depositing a first layer of metal;
    b) depositing a second layer of metal;
    c) plating and patterning a layer of solder above said second layer of metal;
    d) reflowing the patterned solder by melting to form a set of spheroidal solder ball contacts having a bottom diameter abutting said second layer of metal:
    e) etching the second layer of metal using the solder ball contacts as a mask;
    f) applying a positive photoresist having a viscosity, and a solvent having a chemical composition, at a temperature such that the solvent wets the solder at said bottom diameter;
    g) exposing and stripping said photoresist using the solder ball contacts as a self aligned exposure mask, thereby forming a protective ring about said bottom diameter: and
    h) etching said first layer of metal, so that said solder is resting on a shoulder of said first layer of metal, the etched first layer of metal forming a disk under each solder ball contact larger than a disk formed by the second layer of metal.

2. The method recited in claim 1 wherein said first metal is chromium and said second metal is copper, the photoresist covering and protecting an interface between the copper and the solder.

3. The method recited in claim 1 further comprising the step of removing the photoresist ring after said etching step (h).

4. The method recited in claim 1 wherein depositing said second layer of metal is performed by sputter depositing chromium in compression, followed by evaporating CrCuAu in tension to reduce the film stress.

5. The method recited in claim 1 wherein depositing said second layer of metal is performed by sputter depositing chromium to control stress levels and adhesion to certain insulators, followed by evaporating CrCuAu through a Molybdenum lift-off mask.

6. The method recited in claim 1 wherein said first and second layers of metal are Ti/Ni and Cu/Au, respectively.

7. The method recited in claim 1 wherein said first and second layers of metal are Cr/phased CrCu and Cu, respectively.

8. The method recited in claim 1 wherein said first and second layers of metal are TiW and Cu/Ni, respectively.

9. The method recited in claim 1 further comprising the step of removing the photoresist ring after said etching step (h).

10. A method of forming a metallic contact on an integrated circuit comprising the steps of:
    a) depositing a first layer of metal;
    b) depositing a second layer of metal;
    c) evaporating and patterning a layer of solder above said second layer of metal;
    d) applying a lift-off mask to mask said layer of solder;
    e) etching the second layer of metal;
    f) reflowing the patterned solder by melting to form a set of spheroidal solder ball contacts having a bottom diameter abutting said second layer of metal;
    g) applying a positive photoresist having a viscosity, and a solvent having a chemical composition, at a temperature such that the solvent wets the solder at said bottom diameter;
    h) exposing and stripping said photoresist using the solder ball contacts as a self aligned exposure mask, thereby forming a protective ring about said bottom diameter; and
    i) etching said first layer of metal, so that said solder is resting on a shoulder of said first layer of metal, the etched first layer of metal forming a disk under each solder ball contact larger than a disk formed by the second layer of metal.

11. The method recited in claim 10 wherein said first metal is chromium and said second metal is copper, and the photoresist covers and protects an interface between the copper and the solder.

12. The method recited in claim 10 further comprising the step of removing the photoresist ring after said etching step (i).

13. A method of forming a metallic contact on an integrated circuit comprising the steps of:
    a) depositing a first layer of metal;
    b) depositing a second layer of metal;
    c) plating and patterning a layer of solder above said second layer of metal;
    d) etching the second layer of metal using the solder layer as a mask;
    e) applying a positive photoresist having a viscosity, and a solvent having a chemical composition, at a temperature such that the solvent wets the solder at said bottom diameter:
    f) exposing and stripping said photoresist using the solder layer as a self aligned exposure mask, thereby forming a protective ring about said bottom diameter: and
    g) etching said first layer of metal.

14. The method recited in claim 13 wherein said first metal is chromium and said second metal is copper, and the photoresist covers and protects an interface between the copper and the solder.

* * * * *